(12) United States Patent
Zou et al.

(10) Patent No.: US 10,862,001 B2
(45) Date of Patent: Dec. 8, 2020

(54) DISPLAY DEVICE AND ELECTRONICS APPARATUS

(71) Applicant: GOERTEK. INC, Shandong (CN)

(72) Inventors: Quanbo Zou, Shandong (CN); Denio Weng, Shandong (CN); Peixuan Chen, Shandong (CN); Xiangxu Feng, Shandong (CN)

(73) Assignee: GOERTEK. INC, Shandong (CN)

( * ) Notice: Subject to any disclaimer, the term of this patent is extended or adjusted under 35 U.S.C. 154(b) by 141 days.

(21) Appl. No.: 16/339,494

(22) PCT Filed: Oct. 8, 2016

(86) PCT No.: PCT/CN2016/101476
§ 371 (c)(1),
(2) Date: Apr. 4, 2019

(87) PCT Pub. No.: WO2018/064806
PCT Pub. Date: Apr. 12, 2018

(65) Prior Publication Data
US 2019/0237618 A1 Aug. 1, 2019

(51) Int. Cl.
*H01L 33/06* (2010.01)
*H01L 27/32* (2006.01)
*H01L 51/50* (2006.01)
*H05B 33/14* (2006.01)
*H01L 25/075* (2006.01)
*H01L 27/12* (2006.01)
*H01L 27/15* (2006.01)
(Continued)

(52) U.S. Cl.
CPC .......... *H01L 33/06* (2013.01); *H01L 25/0753* (2013.01); *H01L 27/1218* (2013.01); *H01L 27/156* (2013.01); *H01L 27/32* (2013.01); *H01L 33/50* (2013.01); *H01L 51/502* (2013.01); *H05B 33/14* (2013.01); *H05B 33/145* (2013.01); *H01L 25/167* (2013.01)

(58) Field of Classification Search
CPC ............... H01L 27/156; H01L 27/1218; H01L 27/1225; H01L 27/3244; H01L 33/06; H01L 33/14; H01L 33/28; H01L 51/502; H01L 51/5004; H01L 51/5076; H01L 51/5096; H01L 51/506
See application file for complete search history.

(56) References Cited

U.S. PATENT DOCUMENTS 8,215,815 B2  7/2012  Meir et al.
2018/0206299 A1* 7/2018 Chen ................. H01L 27/32

FOREIGN PATENT DOCUMENTS

CN  103148406 A  6/2013
CN  103499054 A  1/2014
CN  105044963 A  11/2015

* cited by examiner

*Primary Examiner* — Cuong Q Nguyen
(74) *Attorney, Agent, or Firm* — Ajay A. Jagtiani; Miles & Stockbridge P.C.

(57) ABSTRACT

A display device and an electronics apparatus are provided. The display device comprises: a display substrate; and arrays of light-emitting elements on the display substrate, wherein the light-emitting elements include at least two types of electroluminescent quantum-dot LED, photoluminescent quantum-dot LED and micro-LED, wherein at least one type of the light-emitting elements is an electroluminescent quantum-dot LED, or at least two types of the light-emitting elements are micro-LED.

10 Claims, 4 Drawing Sheets

(51) Int. Cl.
*H01L 33/50* (2010.01)
*H01L 25/16* (2006.01)

US 10,862,001 B2

DISPLAY DEVICE AND ELECTRONICS APPARATUS

CROSS REFERENCE TO RELATED APPLICATIONS

This application is a National Stage of International Application No. PCT/CN2016/101476 filed on Oct. 8, 2016 which is hereby incorporated by reference in its entirety.

FIELD OF THE INVENTION

The present invention relates to the field of LED display device, and more specifically, to a display device and an electronics apparatus.

BACKGROUND OF THE INVENTION

The micro-LED technology refers to the LED array of small size integrated on a substrate with high density. Currently, the micro-LED technology is starting development, and it is expected in the industry that a high-quality micro-LED product comes into the market. High-quality micro-LEDs will have a deep affection on the conventional display products such as LCD/OLED that have already been put into the market. The micro-LEDs include inorganic Light Emitting Diodes and organic Light Emitting Diodes.

A micro-LED display device is a device with micro-LED array. Currently, a high quality micro-LED display device has encountered manufacturing difficulty in high resolution display.

Quantum dots (QD) LED is considered as a next generation display technology. Generally, there are two types of QD LED, which are an electroluminescent quantum-dot LED and a photoluminescent quantum-dot LED.

A display device can be made by using QD LEDs. In the prior art, there are three types of arrangements of QD LEDs arrays in a display device, which are shown in FIGS. 1-3.

As shown in FIG. 1, electroluminescent QD LED arrays of three colors 104, 105, 106 are arranged in a same layer 102 on a same surface of a display substrate 101. A cover 103 is placed on the top of the electroluminescent QD LEDs to protect them.

As shown in FIG. 2, a red photoluminescent quantum-dot LED array 204, a green photoluminescent quantum-dot LED array 205 and a blue micro-LED array 206 are arranged in a same layer 202 on a same surface of a display substrate 201. The micro-LEDs for exciting the red photoluminescent quantum-dot LED array 204 and the green photoluminescent quantum-dot LED array 205 are blue micro-LEDs. A cover 203 is placed on the top of the LEDs to protect them.

As shown in FIG. 3, photoluminescent QD LED arrays of three colors 304, 305, 306 are arranged in a same layer 302 on a same surface of a display substrate 301. The micro-LEDs for exciting the red photoluminescent quantum-dot LED array 204 and the green photoluminescent quantum-dot LED array 205 are blue micro-LEDs. A cover 203 is placed on the top of the LEDs to protect them.

The design freedom of a prior art QD LED display device is just limited to the same type of QD LEDs or the same type of micro-LEDs.

In addition, the red, green and blue (RGB) sub-pixels within a pixel is horizontally positioned and laid-out in a display substrate in the prior art, which limited the highest display resolution.

Furthermore, different color LED arrays may be transferred onto the display substrate in different transfer procedures, color by color. The subsequent transfer procedure may put negative impact on the LEDs which have already been on the display substrate. Besides, the manufacturing difficulty may also be increased due to surface topography changes after partial color transfer(s).

Therefore, there is a demand in the art that a new solution for a display device shall be proposed to address at least one of the problems in the prior art.

SUMMARY OF THE INVENTION

One object of this invention is to provide a new technical solution for a display device.

According to a first aspect of the present invention, there is provided a display device, comprising: a display substrate; and arrays of light-emitting elements on the display substrate, wherein the light-emitting elements include at least two types of electroluminescent quantum-dot LED, photoluminescent quantum-dot LED and micro-LED, wherein at least one type of the light-emitting elements is an electroluminescent quantum-dot LED, or at least two types of the light-emitting elements are micro-LED.

Optionally or alternatively, the arrays of light-emitting elements include an array of first color electroluminescent quantum-dot LEDs which have a higher efficiency than at least one of other colors of electroluminescent quantum-dot LEDs.

Optionally or alternatively, the first color electroluminescent quantum-dot LEDs are red electroluminescent quantum-dot LEDs.

Optionally or alternatively, the arrays of light-emitting elements include two arrays of two color micro-LEDs which have higher efficiency than the other color micro-LEDs.

Optionally or alternatively, the two arrays of two color micro-LEDs include an array of red micro-LEDs and an array of blue micro-LEDs.

Optionally or alternatively, the arrays of light-emitting elements include an array of green light-emitting elements which are green electroluminescent quantum-dot LEDs or green photoluminescent quantum-dot LEDs.

Optionally or alternatively, the arrays of light-emitting elements are placed in at least two stacked layers on the display substrate.

Optionally or alternatively, wherein the stacked layers include, in sequence from the display substrate, a first stacked layer which includes an array of red light-emitting elements, a second stacked layer which includes an array of green light-emitting elements and a third stacked layer which includes an array of blue light-emitting elements.

Optionally or alternatively, light-emitting elements in different stacked layers are overlapped in vertical direction.

According to a second aspect of the present invention, there is provided an electronics apparatus comprising a display device according to the present invention.

According to an embodiment of this invention, the present invention can provide a display designer with more freedom of design.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
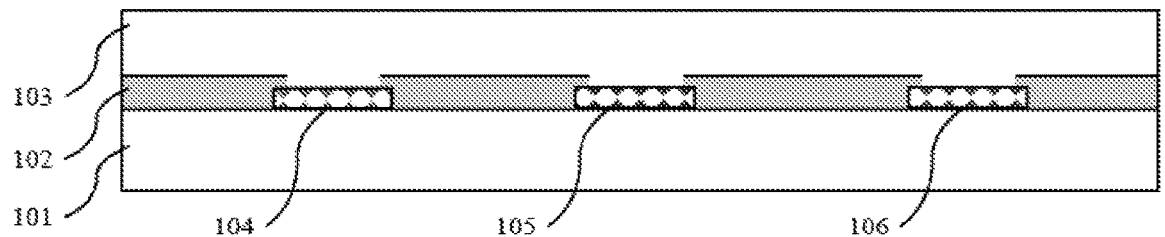
FIGS. 1-3 are schematic diagrams showing arrangements for prior art QD LED display devices.
Figure 2:
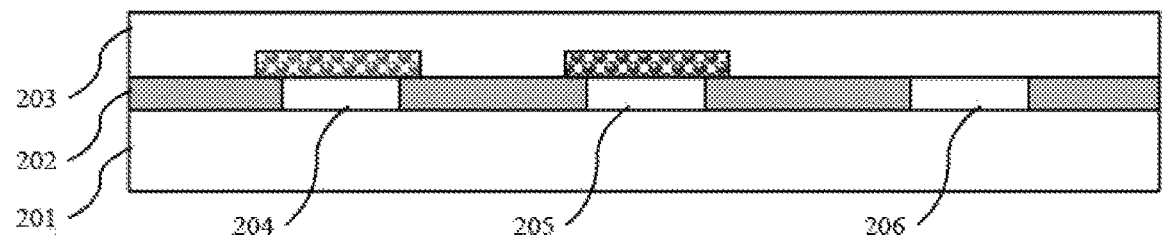
Figure 3:
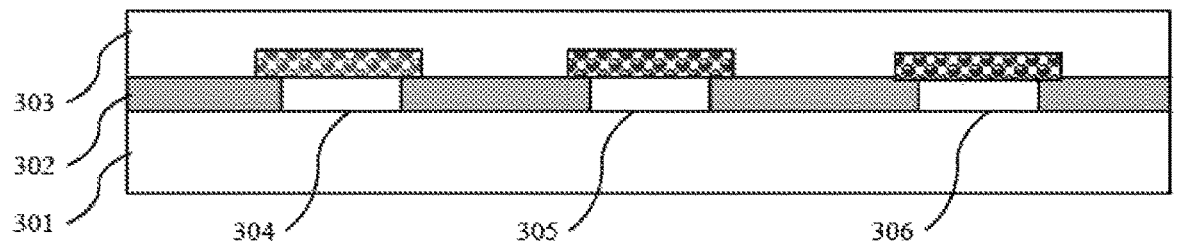

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Basically, the arrangement of QD LEDs is limited to using same type of QD LEDs or micro-LED (blue micro-LED). This will limit the design freedom of a displace designer. For example, the development of different color QD LED and micro-LED are not always synchronized. Some types of QD LED such as blue electroluminescent QD LED may not be efficient currently. Similarly, some types of micro-LED such as green micro-LED may not be efficient currently. If a designer waits for the adequate development of all these elements, the development of the whole display industry may be delayed.

In this invention, it is proposed to use a hybrid arrangement of different types of LEDs. In this manner, a display designer will have more freedom of design.

FIGS. 4-12 are schematic diagrams showing arrangements for QD LED display devices according to embodiments of the present invention.

Figure 4:
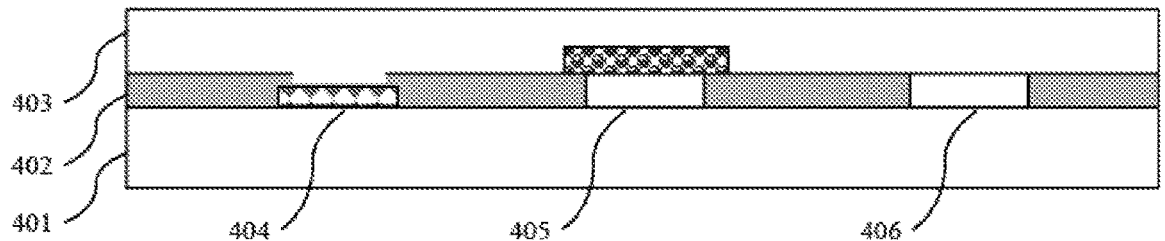
FIGS. 4-12 are schematic diagrams showing arrangements for QD LED display devices according to embodiments of the present invention.

As shown in FIG. 4, the display device comprises a display substrate 401 and arrays 404, 405, 406 of light-emitting elements on the display substrate 401. The light-emitting elements 404, 405, 406 include at least two types of electroluminescent quantum-dot LED, photoluminescent quantum-dot LED and micro-LED, wherein at least one type of the light-emitting elements is an electroluminescent quantum-dot LED, or at least two types of the light-emitting elements are micro-LEDs. For example, the micro-LEDs are made of III-V inorganic compound materials.

For example, the arrays of light-emitting elements 404, 405, 406 include an array of first color electroluminescent quantum-dot LEDs which have a higher efficiency than at least one of other colors of electroluminescent quantum-dot LEDs. For example, the first color electroluminescent quantum-dot LEDs are red electroluminescent quantum-dot LEDs. Said other colors of electroluminescent quantum-dot LEDs include blue electroluminescent quantum-dot LEDs.

As shown in FIG. 4, the red light-emitting elements 404 are red electroluminescent quantum-dot LEDs, the green light-emitting elements 405 are green photoluminescent quantum-dot LEDs, and the blue light-emitting elements 406 are blue micro-LEDs. They are placed in the layer 402. A cover 403 is placed on the top of them for protection.

Figure 5:
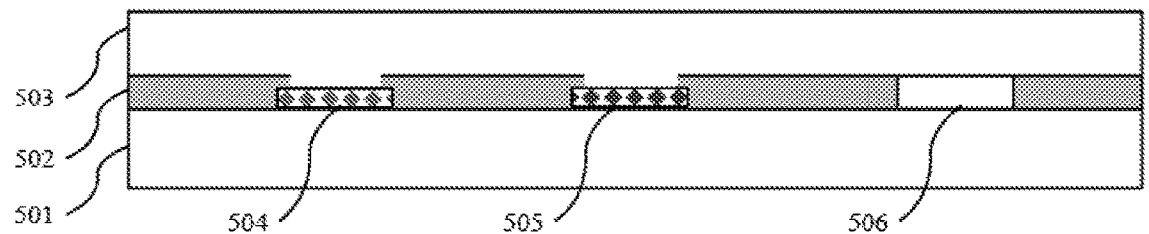

As shown in FIG. 5, an array of red electroluminescent quantum-dot LEDs 504, an array of green electroluminescent quantum-dot LEDs 505 and an array of blue micro-LEDs 506 are arranged on a display substrate 501 in layer 502. A cover 503 is placed on the top of them for protection.

Figure 6:
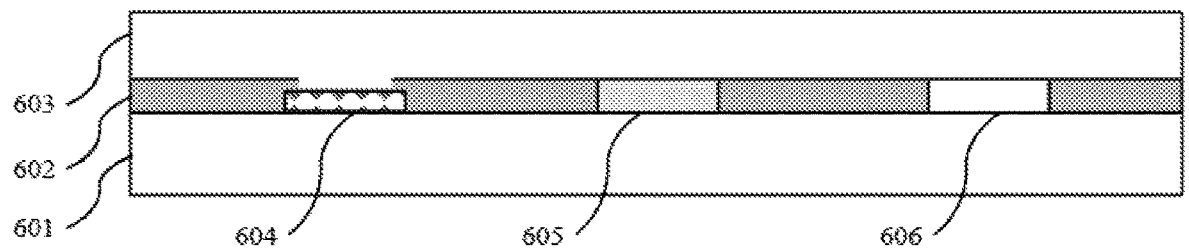

As shown in FIG. 6, an array of red electroluminescent quantum-dot LEDs 604, an array of green micro-LEDs 605 and an array of blue micro-LEDs 606 are arranged on a display substrate 601 in layer 602. A cover 603 is placed on the top of them for protection.

Figure 7:
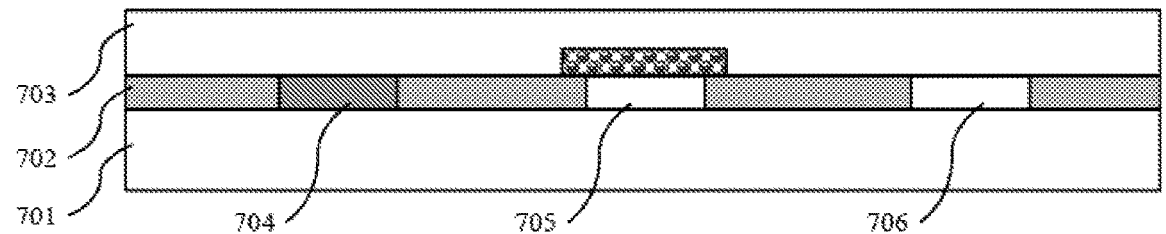

As shown in FIG. 7, an array of red micro-LEDs 704, an array of green photoluminescent quantum-dot LEDs 705 and an array of blue micro-LEDs 706 are arranged on a display substrate 701 in layer 702. A cover 703 is placed on the top of them for protection.

In FIG. 7, the arrays of light-emitting elements include two arrays of two color micro-LEDs which have higher efficiency than the other color micro-LEDs. Specifically, the two arrays of two color micro-LEDs include an array of red micro-LEDs 704 and an array of blue micro-LEDs 706. They have a higher efficiency than the green micro-LEDs.

Currently, the blue electroluminescent quantum-dot LEDs and the green micro-LEDs may have a lower efficiency than other LEDs. In the embodiments of FIGS. 4, 5, 7, the arrays of light-emitting elements include an array of green light-emitting elements 405, 505, 705 which are green electroluminescent quantum-dot LEDs or green photoluminescent quantum-dot LEDs, and the array of blue light-emitting elements 406, 506, 706 are blue micro-LEDs. These embodiments may have more benefits by avoiding using these two types of LEDs.

FIGS. 8-12 shows another aspect of this invention. In the embodiments of FIGS. 8-12, the arrays of light-emitting elements are placed in at least two stacked layers on the display substrate.

Since the micro-LEDs of sub-pixels are placed on different layers. In each layer, the distance between two micro-LEDs is enlarged compared with the prior art solution. Consequently, the manufacture may be easier compared with the prior art solution of putting all micro-LEDs on the same surface. Besides, it may be easier for increasing the display resolution in this manner.

Figure 8:
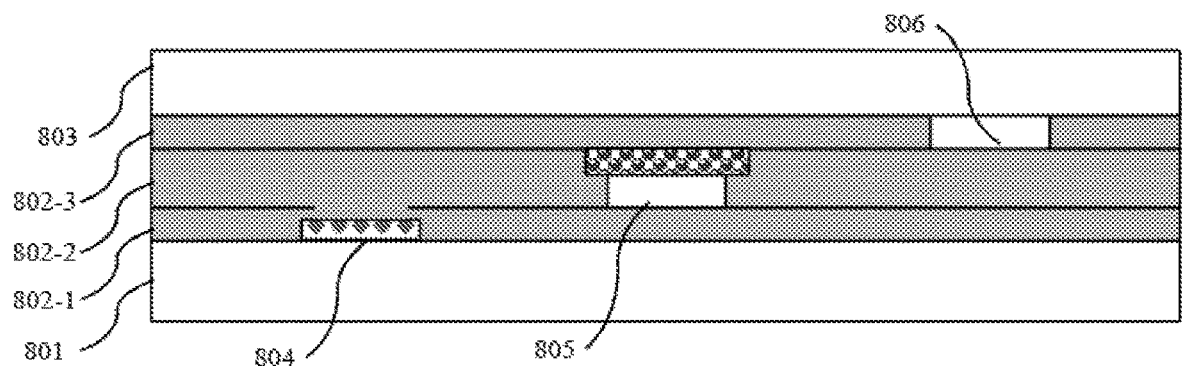

As shown in FIG. 8, the stacked layers include, in sequence from the display substrate 801, a first stacked layer 802-1 which includes an array of red light-emitting elements 804, a second stacked layer 802-2 which includes an array of green light-emitting elements 805 and a third stacked layer 802-3 which includes an array of blue light-emitting elements 806. A cover 803 is placed on the top of them for protection.

In FIG. 8, for example, the red light-emitting elements 804 are red electroluminescent quantum-dot LEDs, the green light-emitting elements 805 are green photoluminescent quantum-dot LEDs, and the blue light-emitting elements 806 are blue micro-LEDs.

In such an arrangement, the influence between different layers of light-emitting elements will be reduced. For example, because the blue color has the highest frequency or has the highest energy among the three colors, it may excite fluorescent light on the other color elements if it is placed beneath them. By the arrangement this invention, it reduces this fluorescence excitation.

In addition, since the light-emitting elements of different colors can be placed in different layers, the impact of a subsequent transfer on the light-emitting elements which have already been placed on the display substrate will be reduced. For example, the red light-emitting elements are first transferred on the display substrate. Because the red and green light-emitting elements are in different layers, the impact on the red light-emitting elements by the transfer of the green light-emitting elements will be lowered. The same situation will be applied to the blue light-emitting elements. This may bring more benefits in this invention, because the light-emitting elements of different colors are of different types. Different types of light-emitting elements may have different requirement during transfer. This arrangement of stacked layers gives a designer much more freedom of design.

Alternatively, the array of light-emitting elements of each color can be placed in a pre-fabricated layer, such as a tape. In this manner, the manufacture process may be simplified. For example, the pre-fabricated layer can be made at a first position and is transported to a display manufacturing factory to be assembled into a display device.

Light-emitting elements, electrodes, filter in the embodiment can be transparent.

In FIG. 8, the light-emitting elements in different stacked layers are not overlapped in vertical direction. However, the light-emitting elements in different stacked layers can be overlapped in vertical direction to further reduce the pixel size.

Figure 9:
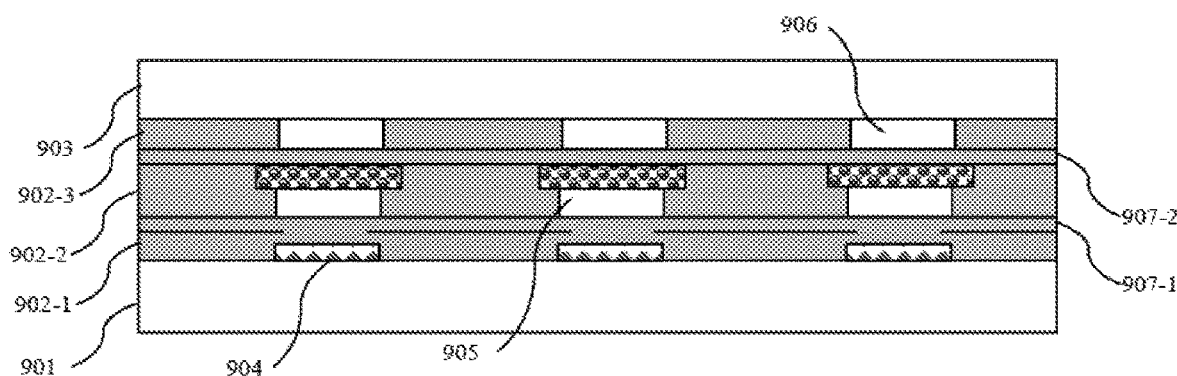

As shown in FIG. 9, the stacked layers include, in sequence from the display substrate 901, a first stacked layer 902-1 which includes an array of red light-emitting elements 904, a second stacked layer 902-2 which includes an array of green light-emitting elements 905 and a third stacked layer 902-3 which includes an array of blue light-emitting elements 906. A cover 903 is placed on the top of them for protection. Dielectric layers 907-1, 907-2 are placed amongst the first stacked layer 902-1, the second stacked layer 902-2 and the third stacked layer 902-3 for isolation. The dielectric layers 907-1, 907-2 can be transparent.

In FIG. 9, for example, the red light-emitting elements 904 are red electroluminescent quantum-dot LEDs, the green light-emitting elements 905 are green photoluminescent quantum-dot LEDs, and the blue light-emitting elements 906 are blue micro-LEDs.

The light-emitting elements in different layers in FIG. 9 are overlapped so that the display resolution may be increased.

Figure 10:
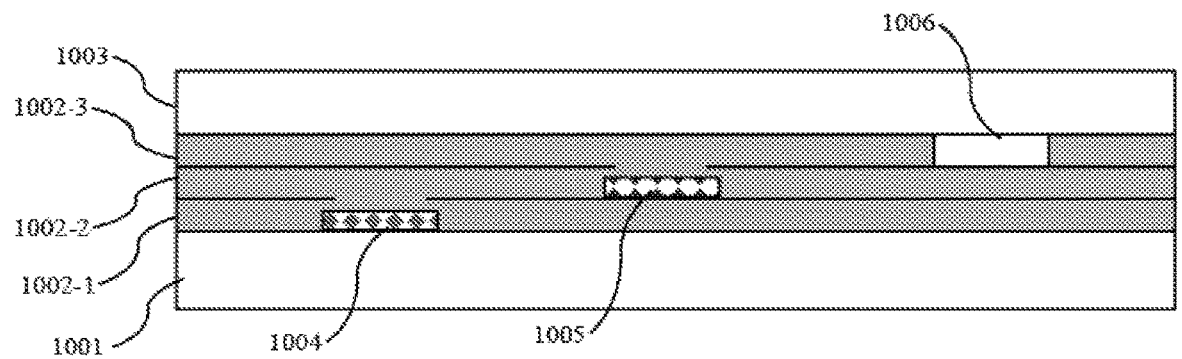

As shown in FIG. 10, the stacked layers include, in sequence from the display substrate 1001, a first stacked layer 1002-1 which includes an array of red electroluminescent quantum-dot LEDs 1004, a second stacked layer 1002-2 which includes an array of green electroluminescent quantum-dot LEDs 1005 and a third stacked layer 1002-3 which includes an array of blue micro-LEDs 1006. A cover 1003 is placed on the top of them for protection.

Figure 11:
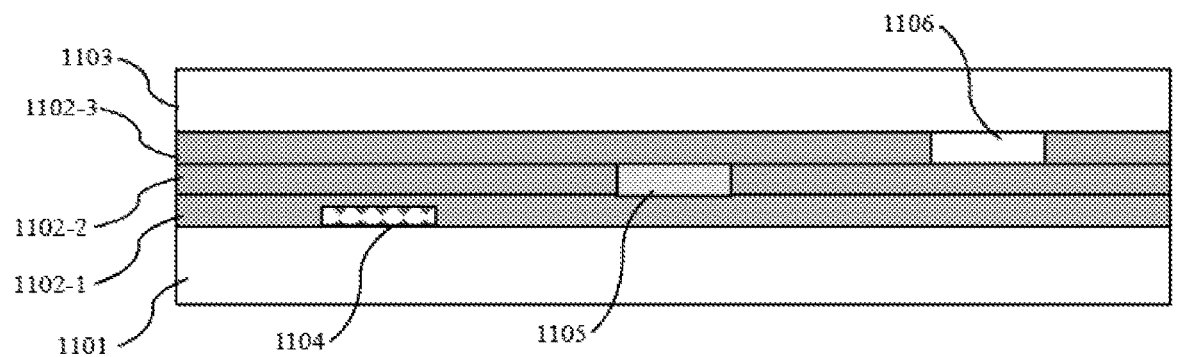

As shown in FIG. 11, the stacked layers include, in sequence from the display substrate 1101, a first stacked layer 1102-1 which includes an array of red electroluminescent quantum-dot LEDs 1104, a second stacked layer 1102-2 which includes an array of green micro-LEDs 1105 and a third stacked layer 1102-3 which includes an array of blue micro-LEDs 1106. A cover 1103 is placed on the top of them for protection.

Figure 12:
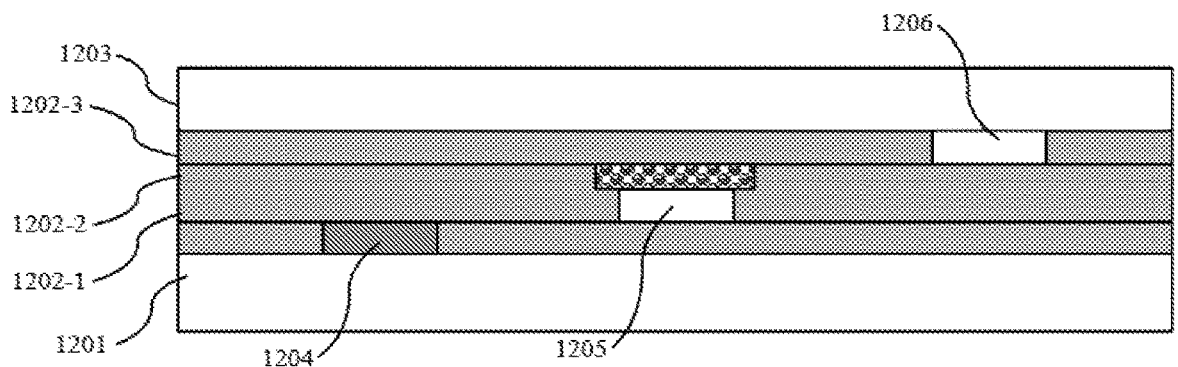

As shown in FIG. 12, the stacked layers include, in sequence from the display substrate 1201, a first stacked layer 1202-1 which includes an array of red micro-LEDs 1204, a second stacked layer 1202-2 which includes an array of green photoluminescent quantum-dot LEDs 1205 and a third stacked layer 1202-3 which includes an array of blue micro-LEDs 1206. A cover 1203 is placed on the top of them for protection.

In FIGS. 10-12, the light-emitting elements are not overlapped. A persons skilled in the art would understand that they can be overlapped as those shown in FIG. 9.

In still another embodiment, the display device according to any embodiment of this invention can be used in an electronics apparatus such as a mobile phone, a pad, a laptop and headset and so on.

Although some specific embodiments of the present invention have been demonstrated in detail with examples, it should be understood by a person skilled in the art that the above examples are only intended to be illustrative but not to limit the scope of the present invention.

What is claimed is:

1. A display device, comprising:
   a display substrate; and
   arrays of light-emitting elements on the display substrate, wherein the light-emitting elements include at least two types of electroluminescent quantum-dot LED, photoluminescent quantum-dot LED and micro-LED,
   wherein at least one type of the light-emitting elements is an electroluminescent quantum-dot LED, or at least two types of the light-emitting elements are micro-LED.

2. The display device according to claim 1, wherein the arrays of light-emitting elements include an array of first color electroluminescent quantum-dot LEDs which have a higher efficiency than at least one of other colors of electroluminescent quantum-dot LEDs.

3. The display device according to claim 2, wherein the first color electroluminescent quantum-dot LEDs are red electroluminescent quantum-dot LEDs.

4. The display device according to claim 1, wherein the arrays of light-emitting elements include two arrays of two color micro-LEDs which have higher efficiency than the other color micro-LEDs.

5. The display device according to claim 4, wherein the two arrays of two color micro-LEDs include an array of red micro-LEDs and an array of blue micro-LEDs.

6. The display device according to claim 1, wherein the arrays of light-emitting elements include an array of green light-emitting elements which are green electroluminescent quantum-dot LEDs or green photoluminescent quantum-dot LEDs.

7. The display device according to claim 1, wherein the arrays of light-emitting elements are placed in at least two stacked layers on the display substrate.

8. The display device according to claim 7, wherein the stacked layers include, in sequence from the display substrate, a first stacked layer which includes an array of red light-emitting elements, a second stacked layer which includes an array of green light-emitting elements and a third stacked layer which includes an array of blue light-emitting elements.

9. The display device according to claim 7, wherein light-emitting elements in different stacked layers are overlapped in vertical direction.

10. An electronics apparatus comprising a display device according to claim 1.

* * * * *